(12) United States Patent
Goehnermeier

(10) Patent No.: US 8,358,402 B2
(45) Date of Patent: Jan. 22, 2013

(54) METHOD OF STRUCTURING A PHOTOSENSITIVE MATERIAL

(75) Inventor: Aksel Goehnermeier, Essingen-Lauterburg (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 349 days.

(21) Appl. No.: 12/698,780

(22) Filed: Feb. 2, 2010

(65) Prior Publication Data

US 2010/0149503 A1 Jun. 17, 2010

Related U.S. Application Data

(63) Continuation of application No. PCT/EP2007/007061, filed on Aug. 9, 2007.

(51) Int. Cl.
*G03B 27/32* (2006.01)
*G03B 27/52* (2006.01)

(52) U.S. Cl. ............... 355/77; 355/46; 355/53; 355/67; 355/70; 355/71

(58) Field of Classification Search ............. 355/46, 355/50, 53, 55, 67, 70, 71, 77
See application file for complete search history.

(56) References Cited

U.S. PATENT DOCUMENTS

| | | | |
|---|---|---|---|
| 4,992,825 A | 2/1991 | Fukuda et al. | |
| 5,686,223 A | 11/1997 | Cleeves | |
| 5,706,077 A | 1/1998 | Unno | |
| RE36,731 E * | 6/2000 | Fukuda et al. | 355/53 |
| 6,304,317 B1 | 10/2001 | Taniguchi et al. | |
| 7,352,435 B2 * | 4/2008 | Streefkerk et al. | 355/53 |
| 7,778,723 B2 * | 8/2010 | Cregger | 700/120 |
| 2002/0045136 A1 | 4/2002 | Fritze et al. | |
| 2002/0061472 A1 | 5/2002 | Cooper et al. | |
| 2006/0051979 A1 | 3/2006 | Yoshinaga | |
| 2006/0177778 A1 | 8/2006 | Yen et al. | |
| 2007/0108644 A1 * | 5/2007 | Cregger | 264/1.37 |
| 2007/0172190 A1 | 7/2007 | Takagi et al. | |
| 2010/0149503 A1 * | 6/2010 | Goehnermeier | 355/55 |

FOREIGN PATENT DOCUMENTS

DE 42 32 844 3/1994

OTHER PUBLICATIONS

Sun et al., "Projection micro-stereolithography using digital micromirror dynamic mask," Sensors and Actuators A, 121 (2005) 113-120.
International Search Report and Written Opinion for the corresponding PCT Application No. PCT/EP2007/007061, bearing the date Jan. 7, 2008.
International Preliminary Report on Patentability for the corresponding PCT Application No. PCT/EP2007/007061, bearing the date Feb. 9, 2010.

* cited by examiner

*Primary Examiner* — Thomas R Artman
(74) *Attorney, Agent, or Firm* — Fish & Richardson P.C.

(57) ABSTRACT

A method of structuring a photosensitive material is disclosed. The method includes illuminating a first object structure and projecting a pattern of the first object structure onto a photosensitive material such that the projected pattern of the first object structure is focussed at a first focus position with respect to the photosensitive material. The method also includes illuminating a second object structure and projecting a pattern of the second object structure onto the photosensitive material such that the projected pattern of the second object structure is focussed at a second focus position with respect to the photosensitive material. The respective patterns are projected in the same projection direction.

22 Claims, 12 Drawing Sheets

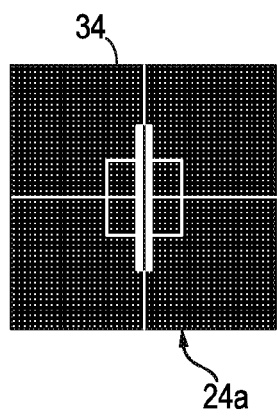 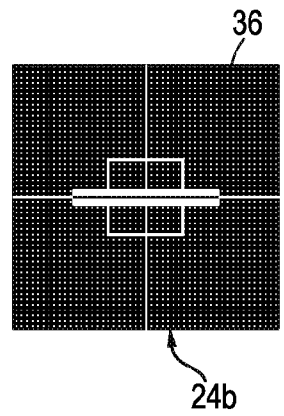 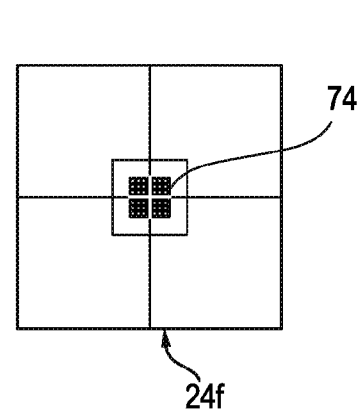
FIG. 16   FIG. 17   FIG. 18
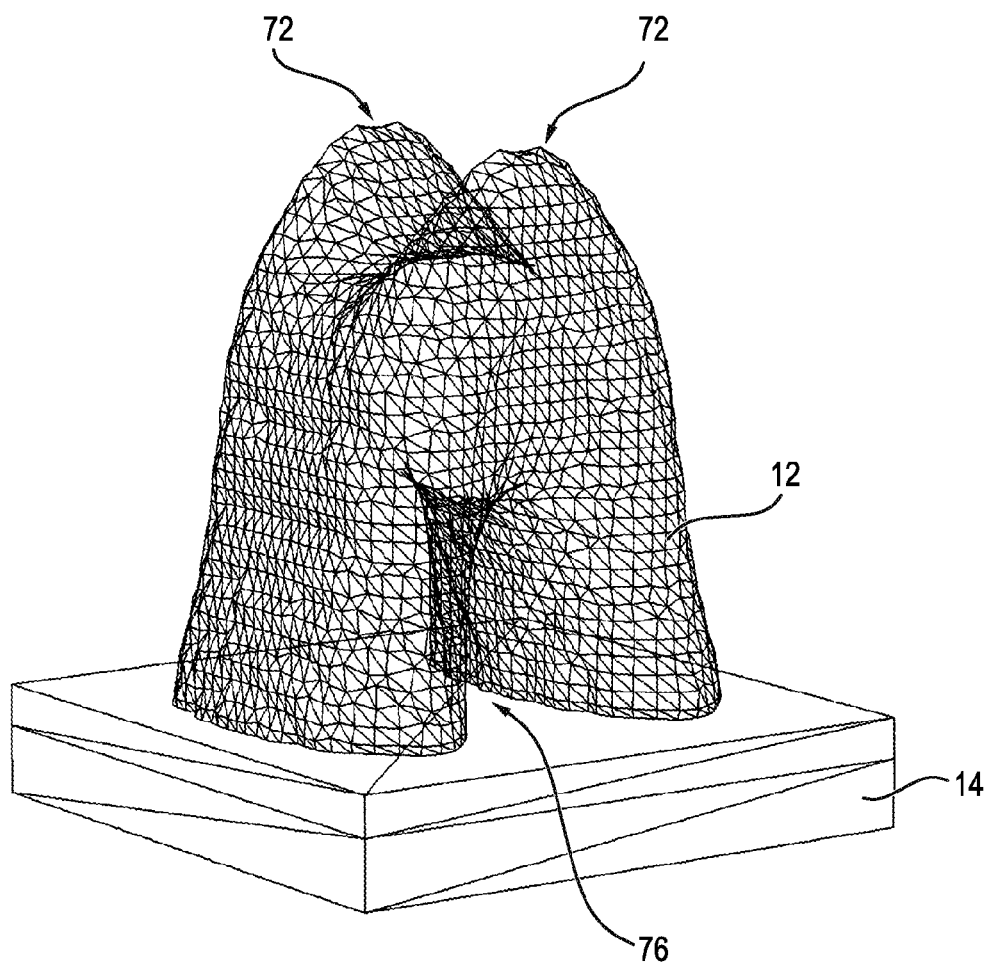
FIG. 19

METHOD OF STRUCTURING A PHOTOSENSITIVE MATERIAL

CROSS-REFERENCE TO RELATED APPLICATION

This application is a continuation of, and claims priority under 35 U.S.C. §120 to, PCT patent application serial no. PCT/EP2007/007061, filed Aug. 9, 2007, the entire contents of which are hereby incorporated by reference.

FIELD

The disclosure relates to a method of structuring a photosensitive material, a projection exposure system for structuring a photosensitive material, and a mask for a projection exposure system.

BACKGROUND

Microlithography is a well known technique used to create two-dimensional structures. It involves transferring a structure from one surface to another. For example, a common type of lithography, known as photolithography, is the driving technology in manufacturing Integrated Circuits (ICs). In photolithography a permanent mask, for example, is made of an opaque material that is selectively located on a transparent substance in the desired structure. Light is incident on the mask and a shadow or pattern from the structured opaque regions is cast onto a substrate coated with a photosensitive material known as photo-resist. The photo-resist changes its chemical properties when light impinges upon it. The resist is then developed to remove the exposed (or unexposed) areas of the resist. In this process, the structure from the mask is transferred to the photo-resist. Further processing is usually performed by developing and other processing to create resistant structures.

SUMMARY

In some embodiments, the disclosure provides a method and a projection exposure system for three-dimensional structuring of a photosensitive material, and therefore for generating three-dimensional structures or shapes in the photosensitive material, in a cost efficient manner.

In certain embodiments, the disclosure provides a method of structuring a photosensitive material including the steps of: illuminating a first object structure and projecting a pattern of the first object structure onto the photosensitive material such that the projected pattern of the first object structure is focussed at a first focus position with respect to the photosensitive material; illuminating a second object structure and projecting a pattern of the second object structure onto the photosensitive material such that the projected pattern of the second object structure is focussed at a second focus position with respect to the photosensitive material, wherein the respective patterns are projected in the same projection direction.

In some embodiments, the disclosure provides a projection exposure system for structuring a photosensitive material, which projection exposure system includes: an illumination system for illuminating a first object structure and a second object structure; at least one optical projection objective for projecting a respective pattern of the first object structure and the second object structure onto the photosensitive material; and a control system for controlling the operation of the projection exposure system such that the projected pattern of the first object structure is focussed at a first focus position with respect to the photosensitive material, that the projected pattern of the second object structure is focussed at a second focus position with respect to the photosensitive material and that the respective patterns are projected in the same projection direction.

The different focus positions at which the different object structures are focussed can cover extended areas in the projection direction in which the projected pattern is in focus. The photosensitive material that is structured can, for example, be a photo-resist layer formed on a silicon substrate as typically used in microlithography.

In other words, the single patterns of the different object structures are focussed at different focus positions with respect to the photosensitive material. Therefore, the focus points of the different projected patterns are shifted in the projection direction.

By focussing the projected patterns of the respective object structures at different focus positions at least two structures are created in different levels of the photosensitive material, which can be two-dimensional in approximation. The created structures together form a three-dimensional structure or shape in the photosensitive material. The disclosure is based on the insight that three-dimensional structural information transferred into the photosensitive material can be decomposed into at least two sections which are independently exposed into the photosensitive material. As elaborated above, this is done by projecting the different object structures at different focus positions onto the photosensitive material. In order to yield a distinct focus-range of the projected patterns, the structures are advantageously illuminated appropriately. As the projection of both object structures is performed in the same direction, a projection exposure system for performing the method can be developed on the basis of projection exposure systems generally used in microlithography. Therefore the cost and effort involved in manufacturing projection exposure system adapted for performing the method remains limited. It is for example possible to manufacture the three-dimensional photonic crystal described in the patent application US 2007/0172190A1.

In some embodiments, the respective patterns are projected onto the same location of the photosensitive material in a plane perpendicular to the projection direction. The same location of the photosensitive material in a plane perpendicular to the projection direction in this context means that the respective patterns at least overlap or are even centered on the same point of the plane. In other words, according to such embodiments, the patterns of the different object structures are projected onto the same location of the photosensitive material and therefore onto the same location in a plane perpendicular to the projection direction.

In certain embodiments, the first focus position and the second focus position are both located within the photosensitive material. This way the image patterns of the respective object structures are precisely defined in the respective focal planes defined by the different focus positions. This allows the formation of a precisely shaped three-dimensional structure.

In some embodiments, the photosensitive material has a given thickness in the projection direction and a distance between the first focus position and the second focus position is at least 10%, such as at least 50%, of the given thickness. This way it can be ensured that the irradiation profiles of the different image structures in the photosensitive material do not significantly interfere with each other. Therefore, the irradiation profiles generated in the different focal planes of the photosensitive material are distinct enough to allow the formation of a precisely shaped three-dimensional structure.

In certain embodiments, the photosensitive material has a given thickness in the projection direction, each of the object structures is illuminated by light rays having an angular distribution, which angular distribution is adapted to the shape of the illuminated object structure such that an irradiation profile of at least one of the projected patterns, in particular both of the projected patterns, extends in the projection direction inside the photosensitive material by less than 50% of the given thickness, in particular by less than 10% of the given thickness, of the photosensitive material. The angular distribution of the light illuminating the object structures is generally referred to as an "illumination setting". Such an illumination setting can include, for example, standard illumination of various partial coherence settings, annular illumination or quadrupole illumination. According to certain embodiments, the illumination setting is chosen depending on the shape of the illuminated object such that the resulting irradiation profile of the projected pattern extends in a small layer within the photosensitive material. Ideally, the depth of focus of the image is adjusted such that exclusively the desired sectional plane within the photosensitive material is illuminated. The term "extending" of the irradiation profile within the photosensitive material in this context means that the intensity level of the irradiation profile is sufficient to change a characteristic property of the photosensitive material, for example is sufficient to expose photo-resist such that the resist material can be removed during subsequent development. In the area, which the irradiation profile does not "extend" to, the intensity level is so small that the characteristic property of the photosensitive material is not changed. According to such embodiments, the image structures formed in the different focal planes do not overlap with each other and therefore a precisely shaped three-dimensional structure can be obtained.

In some embodiments, the first object structure is illuminated by light rays having a first angular distribution and the second object structure is illuminated by light rays having a second angular distribution. Therefore the different object structures are exposed in different exposure steps, wherein between the exposure steps the illumination setting is changed.

In certain embodiments, at least one of the object structures is projected onto the photosensitive material as a dark field image. A dark field image in generated by object structures, which are transmissive to light, for example transmissive slits or holes, surrounded by an opaque or dark background. This is in contrast to bright field images, in which the object structures are opaque elements surrounded by a transmissive background. Therefore, according to such embodiments, the images of the object structures on the photosensitive material are illuminated elements. This way more complex three-dimensional structures can be formed in the photosensitive material, which photosensitive material is advantageously in the form of positive photo-resist.

In some embodiments, at least one of the object structures is projected onto the photosensitive material as bright field image and the projected pattern extends in the direction of the projection direction by more than 80% of the thickness of the photosensitive material, such as by more than 100% of the thickness of the photosensitive material.

In certain embodiments, spherical aberrations in a wave front of at least one of the projected patterns are caused by interaction of the light of the projected pattern with the photosensitive material and the spherical aberrations are corrected by one or more optical projection objectives that project the respective pattern onto the photosensitive material. A resist layer having a thickness of several microns can cause significant spherical aberrations. According to such embodiments these aberrations are e.g. corrected in the optical projection projective via manipulators for adjusting the Zernike coefficient Z9 to be constant over the exposure field. The at least one projection objective advantageously corrects the spherical aberrations depending on the focus setting and type of photosensitive material.

In some embodiments, the object structures are located on separate masks and after projecting the pattern of the first object structure a mask change is performed. A first mask containing the first object structure is arranged in an exposure position of the projection exposure system for a first exposure step projecting the first object structure onto the photosensitive material. Subsequently, the first mask is removed from the exposure position and a second mask containing the second object structure is brought into the exposure position. Thereupon the second structure is projected onto the photosensitive material.

In certain embodiments, the patterns are projected onto the photosensitive material using one or more optical projection objectives having a numerical aperture of NA, the patterns generate material structures in the photosensitive material and the process of generating the material structures from the object structures is determined by the lithographic process constant k1, wherein NA and k1 satisfy the following relation: NA/k1>0.5. The lithographic process constant k1 of a lithographic imaging process is defined by the following equation:

$$R = k1 \times \frac{\lambda}{NA},$$

wherein R is the maximum achievable resolution of an object structure imaged onto the photosensitive material and $\lambda$ is the wavelength of monochromatic light used for projecting the object structure onto the photosensitive material. k1 can be influenced by the shape of the object structure, the illumination setting and the properties of the photosensitive material itself. Choosing NA/k1>0.5 results in well defined irradiation profiles in each of the focal planes and therefore allows a three-dimensional structure to be manufactured with a high precision.

In some embodiments, after projecting the object structures onto the photosensitive material, the photosensitive material is chemically conditioned such that regions within the photosensitive material which were exposed to light change an optical and/or electrical characteristic. Chemical conditioning can include a development of the photosensitive material, as is typical after the exposure of photo-resist. The optical characteristic to be changed by the chemical conditioning in the regions, which were exposed to light, advantageously includes the refractive index or the transmission property of the photosensitive material to light. No material has to be extracted during the chemical conditioning. The structuring of the photosensitive material in this case is not achieved by removing material to achieve the three-dimensional structure but in that three-dimensional regions of different material characteristics are produced in the photosensitive material. An electrical characteristic varying between the different regions according to such embodiments can include, for example, the electrical resistance of the photosensitive material.

In some embodiments, the pattern of the first object structure is projected onto the photosensitive material in a first exposure step and the pattern of the second object structure is projected onto the photosensitive material in a subsequent exposure step. The photosensitive material remains unchanged between both exposure steps.

In some embodiments, the first object structure differs from the second object structure in its orientation, shape and/or size. This way three-dimensional objects having a complex shape can be produced.

In certain embodiments, the object structures are simultaneously illuminated by light having two different optical properties, the pattern of the first object structure is generated predominantly or completely from first light having the first of the optical properties and the pattern of the second object structure is generated predominantly or completely from second light having the second one of the optical properties. According to such embodiments, both object structures can be projected onto the photosensitive material during a single exposure step as both patterns are generated separately.

In some embodiments, the patterns are projected onto the photosensitive material by the optical projection projective, which is adapted to focus the first light at the first focus position and the second light at the second focus position. Therefore, the images of the object structures can be focussed at different focus positions at the same location of the photosensitive material in only one exposure step.

It is further advantageous, if different optical properties are different optical wavelengths of the light illuminating the object structures. In certain embodiments, the different optical properties are different orthogonal polarisation states of the light. Both in the case, in which the first light and the second light have different wavelengths, and in the case, in which the first light and the second light have different orthogonal polarisation states, the first light and the second light can be handled by the projection objective(s) separately. Therefore, the first light and the second light can be projected to different focus positions by the projection objective(s) without interfering with each other.

In some embodiments, a projection exposure system for structuring a photosensitive material includes: a mask holder for holding a mask having a first object structure and a second object structure at different locations of the mask; a material holder for holding the photosensitive material; an optical projection objective for imaging the mask onto the photosensitive material; and a control system for controlling the projection exposure system to automatically perform a double exposure of the mask in which, in a first exposure step the first object structure, and in a second exposure step the second object structure is imaged onto the photosensitive material, such that the first object structure and the second object structure are imaged onto the same location of the photosensitive material and the photosensitive material remains on the material holder during the double mask exposure.

In other words, the projection exposure system is configured to perform a so called double mask exposure. In a first exposure step of the double mask exposure a first object structure on the mask is imaged onto a certain location of the photosensitive material. As also mentioned above, the location on the photosensitive material is defined as a location in a plane perpendicular to a projection direction of the optical projection objective. Subsequently, a second object structure located on the mask is imaged onto the same location of the photosensitive material. The projection exposure system is configured to automatically perform this double mask exposure. Such a projection exposure system allows the method described above to be performed efficiently.

In some embodiments of the projection exposure system, the control system is adapted to control the projection exposure system such that in the first exposure step the first object structure is imaged onto the photosensitive material at a first focus setting of the optical projection objective and in the second exposure step the second object structure is imaged onto the photosensitive material at a second focus setting of the optical projection objective. The different focus settings can, for example, be adjusted by moving the material holder, holding the photosensitive material, in the direction of an optical axis of the optical projection objective.

In certain embodiments the mask includes a first exposure region containing the first object structure and a second exposure region containing the second object structure, and the control system are configured to cause the projection exposure system to project the image of the first region in the first exposure step and the second region in the second exposure step onto the photosensitive material. The first and the second exposure regions can, for example, be the right and the left half of the mask, respectively. During the double mask exposure at least respective portions of the exposure regions are exposed in an overlapping manner onto the photosensitive material.

In some embodiments, the control system are implemented by hardware and/or software.

In some embodiments, a projection exposure system for structuring a photosensitive material includes two projection objectives each having an optical axis wherein the optical axes are parallel and offset relative to each other and the projection objectives are adjusted to different focus positions.

This way a first object structure and a second object structure can be exposed onto the photosensitive material at different focus positions in a fast and efficient way. No adjustment of the focus position of the photosensitive material or any other adjustment for moving the focus is desirable. Via the projection exposure system the above-mentioned method can be performed efficiently and a large throughput can be achieved. The projection objectives are advantageously small field objectives and the exposure is performed in a "step and flash" mode. In some embodiments, the optical axes of the projection objectives are oriented parallel to each other.

In certain embodiments, the projection exposure system is adapted for projecting a pattern of a first object structure onto the photosensitive material using a first one of the projection objectives and projecting a pattern of a second object structure onto the photosensitive material using the second one of the projection objectives, such that both object structures are projected onto the same location of the photosensitive material. As already mentioned above, the same location of the photosensitive material is considered the same location in a plane perpendicular to the projection direction of the object structures which coincides with the optical axes of the projection objectives. The projection onto the same location of the photosensitive material can be achieved by appropriately moving a material holder stage or wafer stage holding the photosensitive material during the two exposure steps.

In certain embodiments, a projection exposure system for structuring a photosensitive material includes: an optical projection objective for projecting a pattern of an object structure onto the photosensitive material such that the projected pattern is focussed at a focus position within the photosensitive material, wherein the focus position can be altered by adjusting a focus adjustment parameter; an input device for entering at least one characteristic parameter of the photosensitive material and for entering a desired distance between a first focus position and a second focus position within the photosensitive material; a device for calculating an offset value of the focus adjustment parameter from the characteristic parameter and the desired distance, which offset value defines an offset in the focus adjustment parameter involved to adjust the focus position within the photosensitive material from the first focus position to the second focus position; and a device for automatically adjusting the focus adjustment parameter by the calculated offset value.

In other words, the projection exposure system includes an input device for receiving a characteristic parameter or characteristic information of the photosensitive material. This characteristic parameter can, for example, be the refractive index of the photosensitive material. The optical projection objective are adjusted to a first focus position within the photosensitive material. This can, for example, be done by a conventional focus sensor as contained in a typical projection exposure system for microlithography. The first focus position can be adjusted, as is typical in microlithography, by respective calibration of the focus sensor. The projection exposure system further contains a device for calculating a focus adjustment in order to move the focus from the first focus position to a second focus position within the photosensitive material. This is done by calculating an offset value for a focus adjustment parameter from the characteristic parameter and a desired focus offset between the first focus position and the second focus position. The characteristic parameter and the focus offset or desired distance between the two focus positions are used for calculating an offset value for the focus adjustment parameter, which offset value causes the focus to be moved from the first focus position to the second focus position. The offset value of the focus adjustment parameter can, for example, be a shift in the position of a material holder or wafer stage for holding the photosensitive material along an optical axis of the optical projection objective or any other parameter for adjusting the focus of the projection exposure system.

The projection exposure system allows quick and precise adjustment of the focus from the first focus position to the second focus position as no additional focus sensing is desirable. The focus adjustment with respect to the photosensitive material using a focus sensor is typically done once to determine the first focus position. A second focus position is then accessed by applying the calculated offset value of the focus adjustment parameter.

The above object is further solved by a projection exposure system for structuring a photosensitive material, which projection exposure system includes an optical projection objective for projecting a pattern of the object structure onto the photosensitive material; the optical projection objective includes an optical path for guiding light during the projection and a focus adjustment element, which is moveably mounted within the optical projection objective such that it can be moved in and out of the optical path, wherein the focus adjustment element is adapted for causing a shift in a focus setting of the optical projection objective if the focus adjustment element is moved into the beam path.

The focus adjustment element is advantageously configured such that the beam path of the optical beam projecting the pattern onto the photosensitive material is modified such that the focus of the optical projection objective is shifted accordingly. This way the focus shift can be achieved in a quick and precise manner. The focus shift which occurs by inserting the focus adjustment element into the optical beam path is well defined and reproducible. Therefore, the focus shift between the focus positions with and without the focus adjustment element inserted into the optical path is well defined. This projection exposure system allows the above-mentioned method to be performed efficiently and with high precision.

In some embodiments, the projection exposure system is a projection exposure system for microlithography. The projection exposure system can be configured as a stepper or a scanner known in the field of microlithography. The wavelengths used for exposing the photosensitive material can be in the visible and non-visible wavelength range. Examples for appropriate wavelengths are 365 nm, 248 nm, 193 nm, 157 nm or wavelengths in the extreme ultraviolet range, for example 13.5 nm.

In certain embodiments, a mask for a projection exposure system extends along a plane and includes a first mask region and a second mask region, which are offset from each other in a direction perpendicular to the plane. The disclosure further provides a projection exposure system including the above-mentioned mask.

In other words, the mask includes a step between the different mask regions. The mask allows the above-mentioned method to be performed efficiently. The different mask regions being offset from each other allow structures in respective mask regions to be imaged onto the photosensitive material at different focus positions. In order to image object structures located in different mask regions onto the same location of the photosensitive material at different focus positions, the mask simply can be moved in a mask plane between exposure steps.

The features specified above with respect to the method can be transferred correspondingly to the projection exposure system and vice versa. Advantageous embodiments of the projection exposure system and the method resulting therefrom shall be covered by the disclosure of the disclosure.

BRIEF DESCRIPTION OF THE DRAWINGS

The foregoing, as well as other advantageous features of the disclosure will be more apparent from the following detailed description of exemplary embodiments of the disclosure with reference to the following diagrammatic drawings, wherein:

FIG. 16 shows a first mask for use in the projection exposure system shown in FIG. 1;

FIG. 17 shows a second mask for use in the projection exposure system shown in FIG. 1;

FIG. 18 shows a third mask for use in the projection exposure system according to FIG. 1;

FIG. 19 is a three-dimensional view of a photosensitive material structured three-dimensionally using the masks shown in FIGS. 16 to 18;

DETAILED DESCRIPTION

Figure 1:
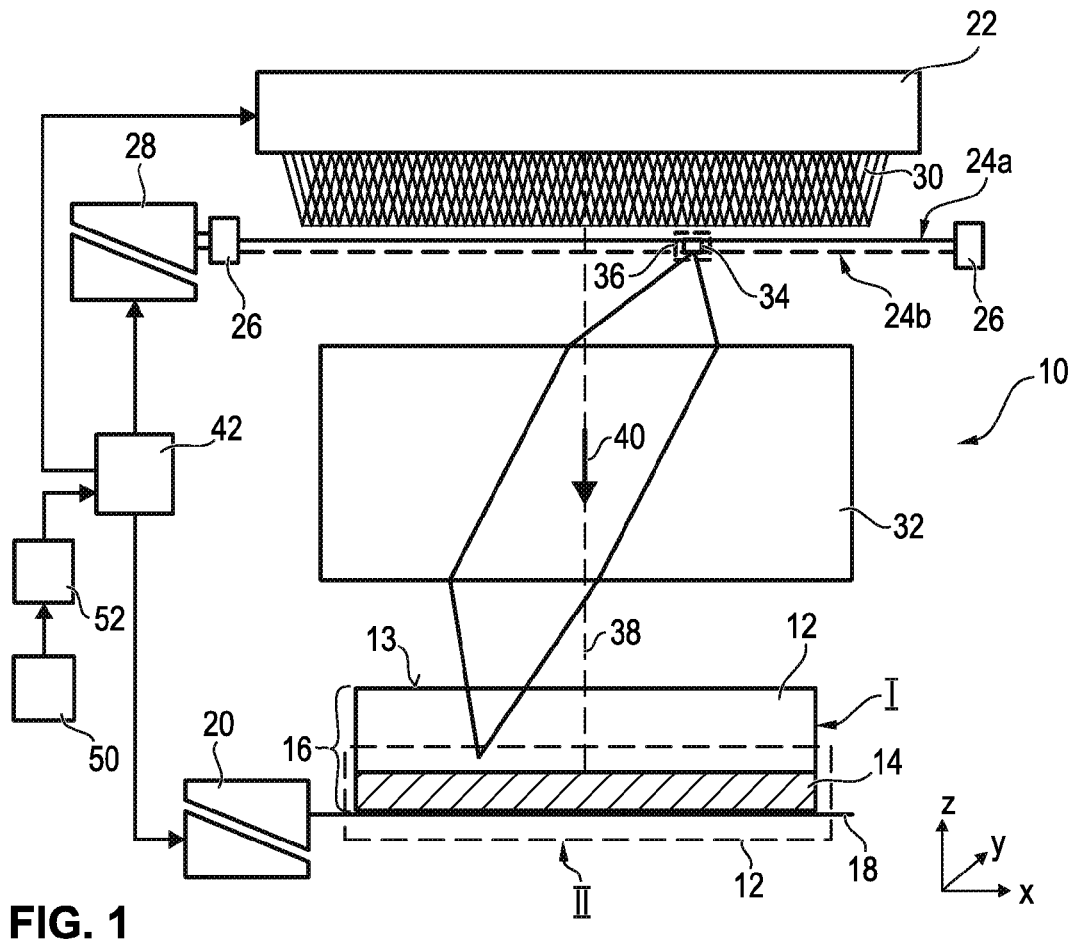
FIG. 1 illustrates a projection exposure system for structuring a photosensitive material.

In the exemplary embodiments of the disclosure described below, components that are alike in function and structure are designated, as far as possible, with the same or alike reference numerals. Therefore, to understand the features of the individual components of a specific embodiment the description of other embodiments or the summary of the disclosure should be referred to.

FIG. 1 is a schematic view of a first exemplary embodiment of a projection exposure system 10. The projection exposure system 10 is adapted for structuring a photosensitive material 12 in the form of a photo-resist layer on a silicon substrate 14. The photosensitive material 12 has a top surface 13 facing away from the silicon substrate 14 and a bottom surface 15 being attached to the silicon substrate 14. The photosensitive material 12 and the silicon substrate 14 together form a wafer 16. The wafer 16 is held by a material holder 18 in the form of a wafer chuck. The material holder 18 is held by a wafer stage 20 which is configured for moving the material holder 18 in x-, y- and z-directions according to the coordinate system of FIG. 1.

The projection exposure system 10 includes an illumination system 22 for illuminating a mask 24a or 24b held by a mask holder 26. The mask holder is attached to a mask stage 28 which allows the respective mask 24a or 24b to be moved in the x-, y-, and z-directions. The illumination system 22 generate illumination radiation 30 having a suitable wavelength for lithographically exposing the masks 24a and 24b onto the wafer 16. Examples of the wavelengths of the illumination radiation 30 are: 365 nm, 248 nm, 193 nm, 157 nm or a wavelength in the EUV-region, for example 13.6 nm.

The illumination system 22 can be configured with different illumination settings. An illumination setting defines the angular distribution of the illumination radiation 30 being incident on mask 24a or 24b. Examples of illumination settings are different partial coherence settings of standard illumination, annular illumination and quadruple illumination. The projection exposure system 10 further includes optical projection objective 32 for projecting a pattern of an object structure 34 or 36 on the masks 24a and 24b, respectively, along an optical axis 38 of the optical projection objective 32 onto the photosensitive material 12. The projection direction 40 along the optical axis 38 is graphically shown in FIG. 1.

The projection exposure system 10 further includes a control system 42 for controlling the illumination system 22, the mask stage 28 and the wafer stage 20. The control system 42 is configured for controlling the projection exposure system 10 to perform the steps detailed in the following.

Figure 3:
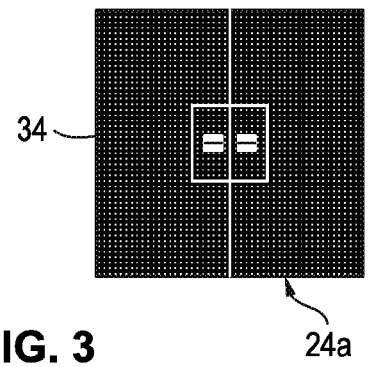
FIG. 3 shows a first mask for use by the projection exposure system according to FIG. 1.

Firstly the first mask 24a is loaded into the mask holder 26. The first mask 24a contains at least one first object structure 34. An example of an exemplary embodiment of the first mask 24a is shown in FIG. 3. The first object structure 34 includes in this case two contact hole mask structures in a dark field environment. That means, the contact hole structures are configured as transmissive elements, wherein their surroundings are opaque, such that the light is blocked therefrom.

Figure 2:
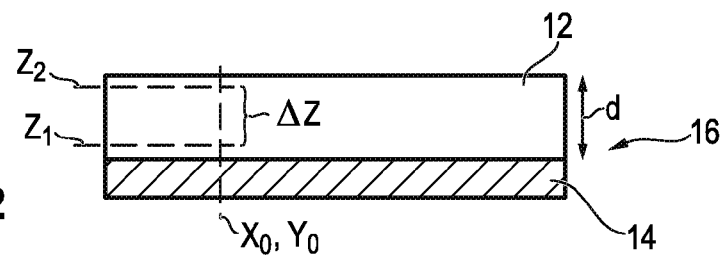
FIG. 2 shows a cross-section of the photosensitive material arranged on a silicon substrate shown in FIG. 1.

In a first exposure step a pattern of the first object structure 34 is projected by the optical projection objective 32 onto the photosensitive material 12. Thereby the pattern of the first object structure 34 is projected in the projection direction 40 along the optical axis 38 of the optical projection objective 32. During the first exposure the wafer 16 is located at a first position I. The photosensitive material 12 in position I is shown in FIG. 1 by continuous lines. The wafer 16 of FIG. 1 is also shown in FIG. 2 for illustration purposes. The pattern of the first object structure 34 is focussed at an image location $(x_0, y_0)$ in the wafer plane which is perpendicular to the projection direction 40. The focus of the projected pattern is located at a first focus position $z_1$ close to the bottom surface 15 of the photosensitive material 12 which has a thickness d in the z-direction along the optical axis 38.

Figure 4:
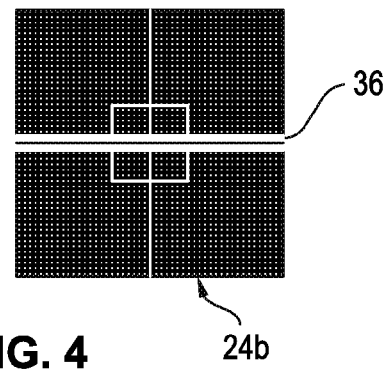
FIG. 4 shows second mask for use by the projection exposure system according to FIG. 1.

After the first exposure step the first mask 24a is removed from the mask stage 28 and a second mask 24b is loaded thereon. An example of a second mask 24b is shown in FIG. 4. The second mask 24b includes at least one second object structure 36 which is, in the case of FIG. 4, a horizontal transmissive line in a dark field surrounding. The second mask 24b and the second object structure 36 are drawn in dotted lines in FIG. 1.

Figure 5:
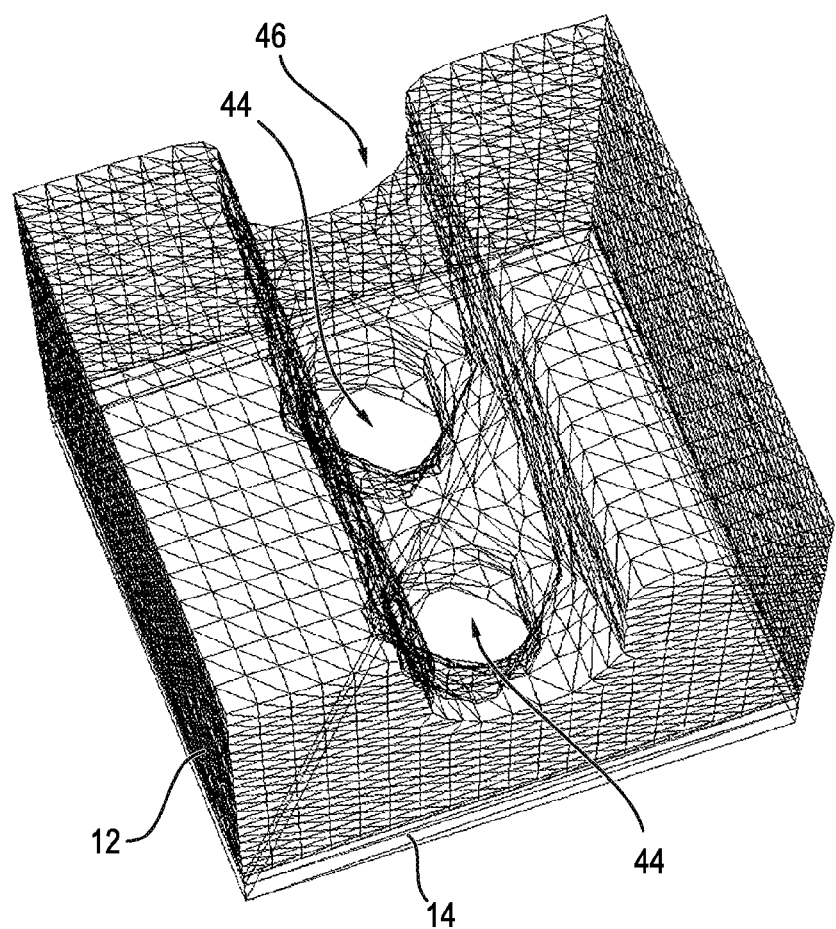
FIG. 5 shows a three-dimensional view of a photosensitive material three-dimensionally structured using the masks shown in FIGS. 3 and 4.
Figure 6:
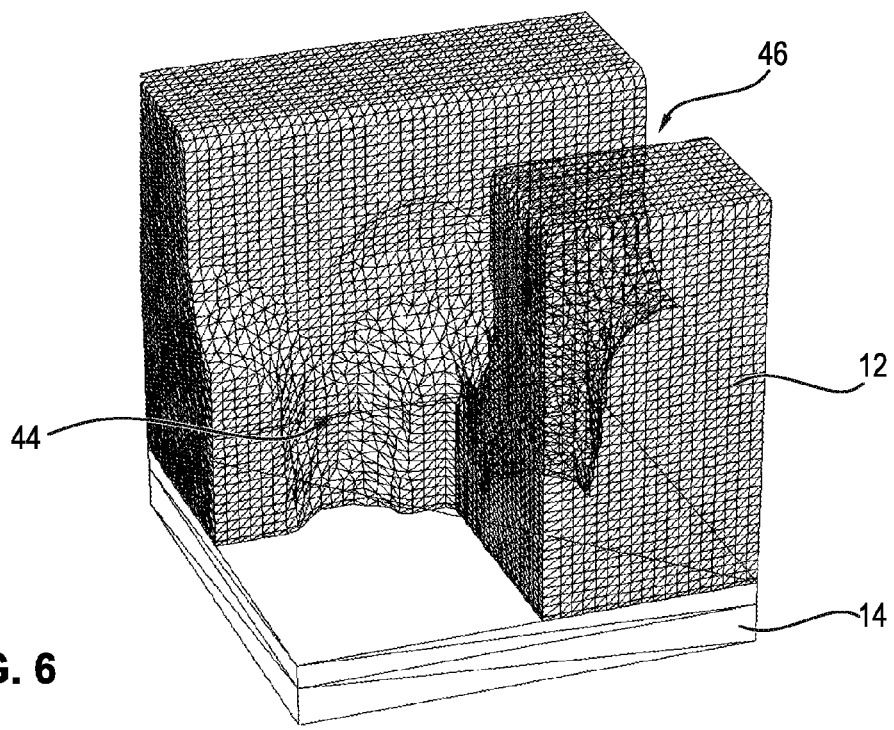
FIG. 6 shows another three-dimensional view of the three-dimensionally structured photosensitive material of FIG. 5.

Subsequently, a pattern of the second object structure 36 is projected onto the same location $(x_0, y_0)$ on the photosensitive material 12 as the pattern of the first object structure 34. However, during the second exposure step the wafer 16 is located at a different z-position. The position of the photosensitive material 12 during the second exposure step is designated by II in FIG. 1 and the photosensitive material 12 is drawn with dotted lines. The movement of the wafer 16 to a different z-position for the second exposure step has the effect that the focus position of the projected pattern of the second object structure 36 is focussed at a second focus position $z_2$ within the layer of photosensitive material 12. The second focus position $z_2$ is close to the top surface 13 of the photosensitive material 12 as can be seen from FIG. 2. The three-dimensional structure generated by the two exposure steps using the masks of FIGS. 3 and 4 is shown in FIGS. 5 and 6. The photosensitive material 12 includes two vertical holes 44 in a lower section thereof which open up into a horizontally oriented groove 46 in the upper section of the photosensitive material 12.

The three-dimensional structures shown in FIGS. 5 and 6 of the photosensitive material 12 are obtained in a photo-resist having a thickness d of 1 μm. The first object structure 34 was exposed in the first exposure step at a defocus setting of 0.2 µm with respect to the upper surface 13 of the photosensitive material 12 and a so called standard illumination setting defined by a partial coherence of σ=0.99 ($\sigma_{inner}$=0, $\sigma_{outer}$=0.99). The size of the holes of the first object structure 34 on the first mask 24a is 0.2 µm and the distance between the holes also 0.2 µm. The partial coherence a of the illumination radiation 30 is defined by the quotient of the numerical aperture of the illumination system 22 generating the illumination radiation 30 and the numerical aperture of the optical projection objective 32. The size of the line of the second object structure 36 shown in FIG. 3 is 0.2 µm. The second exposure is performed at a defocus setting of 1 µm and a standard illumination setting defined by a partial coherence of σ=0.99 ($\sigma_{inner}$=0, $\sigma_{outer}$=0.99). For both exposures a wavelength of 248 nm is used and the optical projection objective 32 have a numerical aperture (NA) of 0.8.

The projection exposure system 10 according to FIG. 1 optionally further includes an input device 50 for entering a characteristic parameter of the photosensitive material 12 in form of the refractive index of the photosensitive material 12 and a desired distance Δz between the first focus position $z_1$ and the second focus position $z_2$ within the photosensitive material 12. Further, the projection exposure system 10 includes a calculation device 52 for calculating an offset value for an adjustment in the z-direction to be performed by the wafer stage 20. The offset value is calculated from the refractive index and the desired distance Δz. Before the first exposure step, the position of the wafer 16 is adjusted relative to the optical projection objective 32 using focus sensors (not shown in the figure). Such focus sensors can be optical or capacitive sensors. After the first exposure step the wafer 16 is moved by the calculated offset value in the z-direction. A further focus adjustment using focus sensors is not required.

Figure 7:
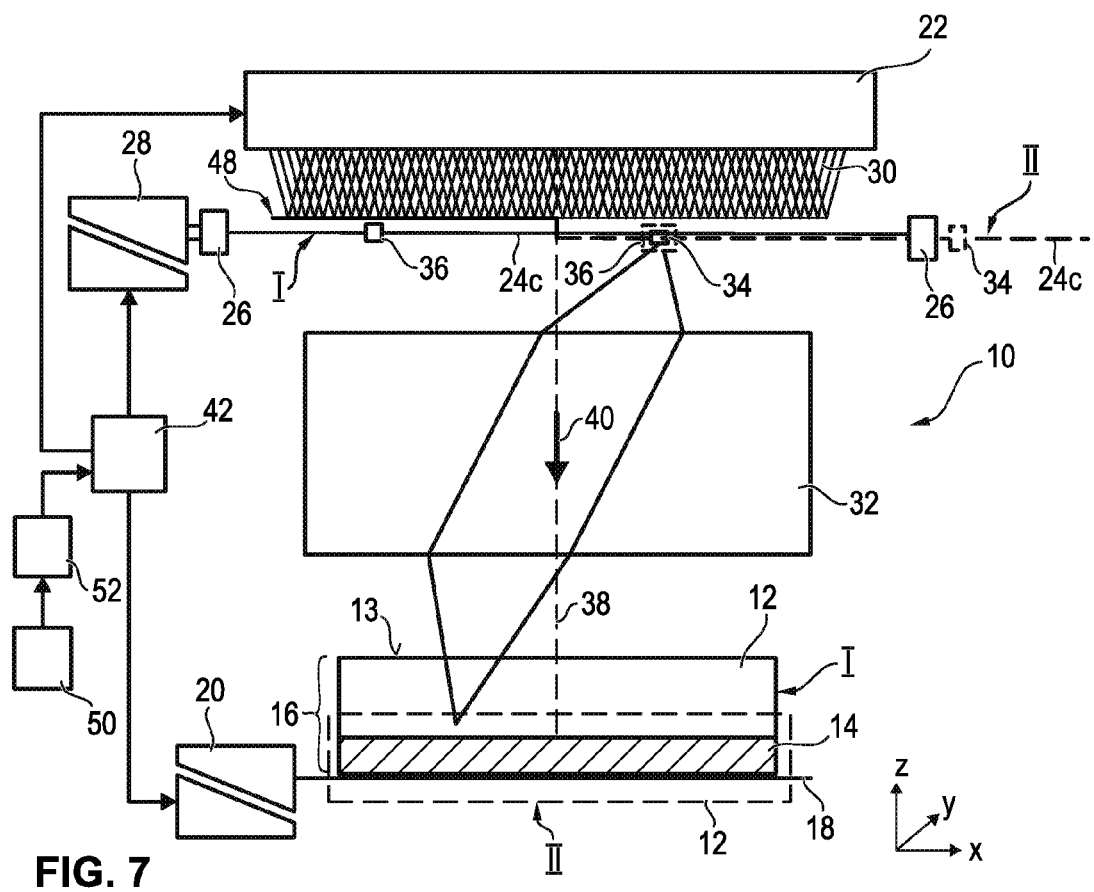
FIG. 7 illustrates a projection exposure system for structuring a photosensitive material.
Figure 8:
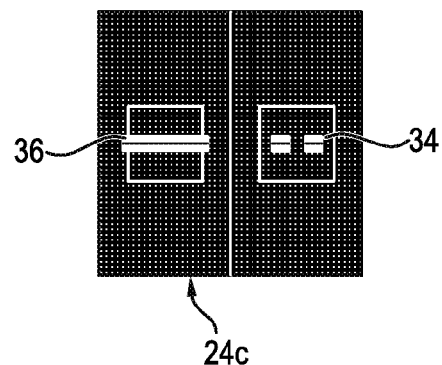
FIG. 8 shows a mask for use in the projection exposure system according to FIG. 7.

FIG. 7 shows a second exemplary embodiment of a projection exposure system 10. This exemplary embodiment differs from the exemplary embodiment shown in FIG. 1 in that it is adapted for conducting the structuring method using a single mask 24c which contains both object structures 34 and 36. An example of the mask 24c is shown in FIG. 8. The first object structure 34 is located on the right half of the mask 24c and the second object structure 36 on the left half of the mask 24c.

During the first exposure step the left half of the mask is blocked from the illumination radiation 30 by a mask blade 48 such that only the first object structure 34 is imaged onto the photosensitive material 12. Subsequently, the right half of the mask is blocked from the illumination radiation 30 by the mask blade 48 and the second object structure 36 is imaged onto the same location of the photosensitive material 12 as the first object structure 34 in the second exposure step. This can be achieved, for example, by moving the mask 24c in the mask plane, as shown in FIG. 7, such that the second object structure 36 is located during the second exposure step at the same location as is the first object structure 34 during the first exposure step. The projection of the structures 34 and 36 of the single mask 24c can also be achieved by appropriately moving the wafer stage 20 and/or the mask stage 28, as will be apparent to the person skilled in the art.

Figure 9:
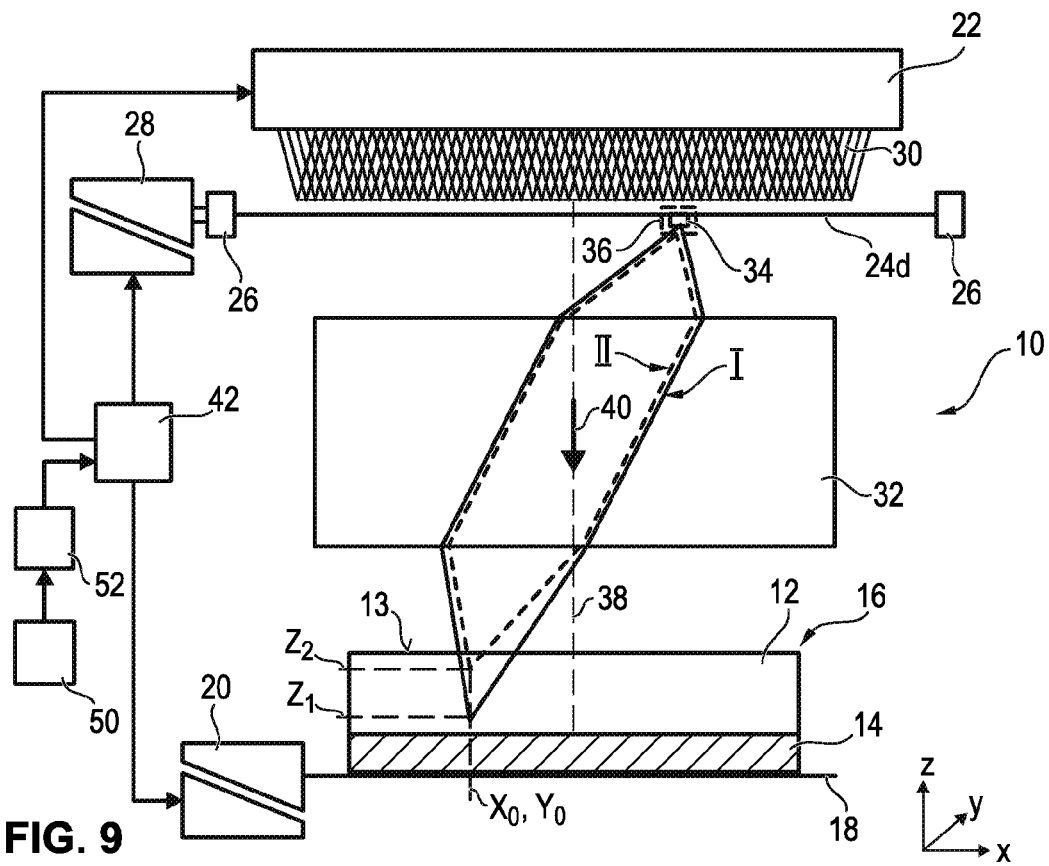
FIG. 9 shows a projection exposure system for structuring a photosensitive material.

FIG. 9 shows a third exemplary embodiment of a projection exposure system 10. This exemplary embodiment differs from the exemplary embodiment according to FIG. 1 in that it is configured for exposing both object structures 34 and 36 using only a single mask 24d. The mask 24d is illuminated by illumination radiation 30 having two different monochromatic wavelengths. The first object structure 34 and the second object structure 36 are both located at the same location of the mask 24d. The first object structure 34 is configured such that its pattern is only generated by first monochromatic light from the illumination radiation 30 having a first wavelength. The second object structure 36 is configured such that its pattern is only generated by second monochromatic light from the illumination radiation 30 having a second wavelength. The optical projection objective 32 is configured such that the first light having the first wavelength is focussed onto the first focus position $z_1$ and the second light having the second wavelength is focussed onto the second focus position $z_2$. The exemplary embodiment of the projection exposure system 10 according to FIG. 9 therefore allows simultaneous imaging of the two object structures 34 and 36 onto different focus positions on the photosensitive material 12.

Figure 10:
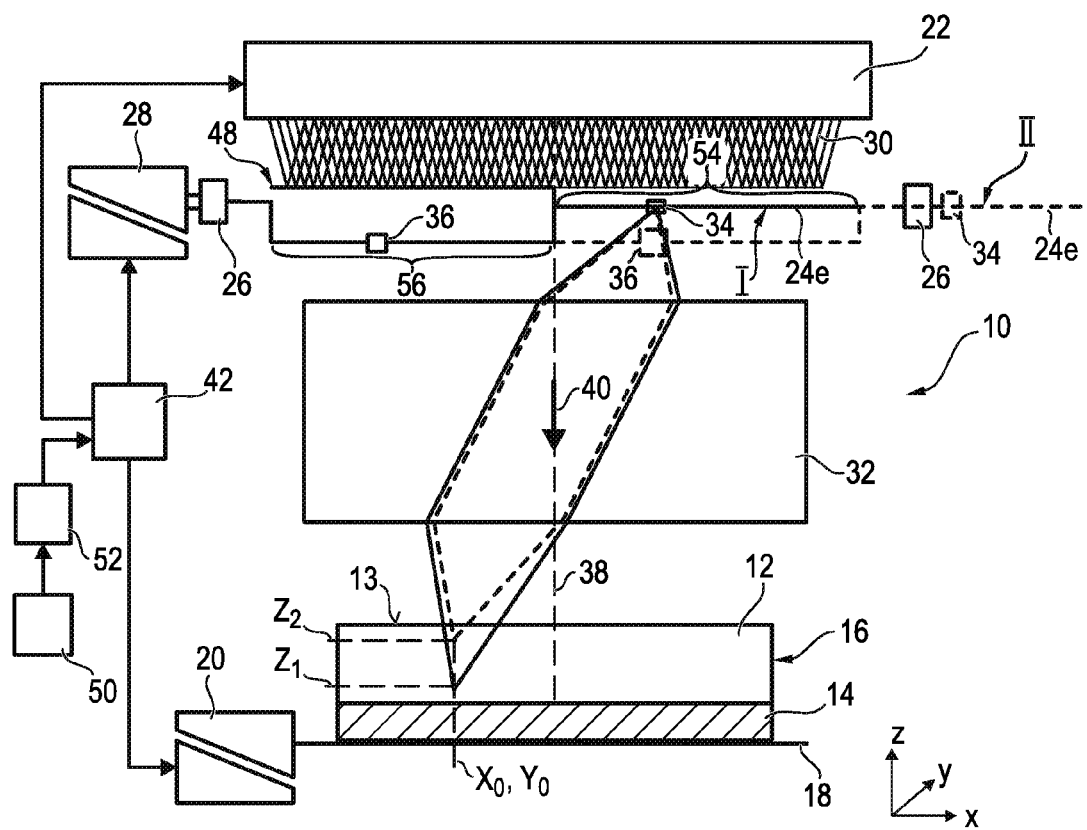
FIG. 10 shows a projection exposure system for structuring a photosensitive material.

FIG. 10 depicts a fourth exemplary embodiment of a projection exposure system 10 which is, like the projection exposure systems shown in FIGS. 7 and 9, also configured for exposing a single mask 24e containing both object structures 34 and 36. The mask 24e extends along a mask plane and includes a first mask region 54 and a second mask region 56 which are offset from each other in the direction of the optical axis 38 of the optical projection objective 32. The first mask region 54 contains the object structure 34 and the second mask region 56 contains the second object structure 36.

In a first exposure step the second mask region 56 is blocked from the illumination radiation 30 by a mask blade 48 such that only the first mask region 54 is imaged onto the photosensitive material 12 in a first focal plane at a first focus position $z_1$. Thereby the first mask structure 34 is imaged onto the location ($x_0$, $y_0$) of the photosensitive material 12. Subsequently, the second mask region 56 is exposed onto the same area of the photosensitive material 12 as was the first mask region 54. This is done such that the second object structure 36 is projected onto the same location ($x_0$, $y_0$) on the photosensitive material 12 as the first mask structure 34.

In the exemplary embodiment illustrated in FIG. 10 this is achieved by moving the mask 24e by the mask stage 28 along the x-direction of the coordinate system of FIG. 10 such that the second object structure 36 is located at the same x-, y-position as is the first object structure 34 in the first exposure step. The position of the mask 24e in the first exposure step is designated in FIG. 10 by I. During a second exposure step the mask 24e is depicted in FIG. 10 by dotted lines and its position is indicated by II. Due to the fact, that the mask regions 54 and 56 are offset from each other in the z-direction, the images of the mask regions 54 and 56 are focussed in the different focal planes at the focus positions $z_1$ and $z_2$, respectively.

Figure 11:
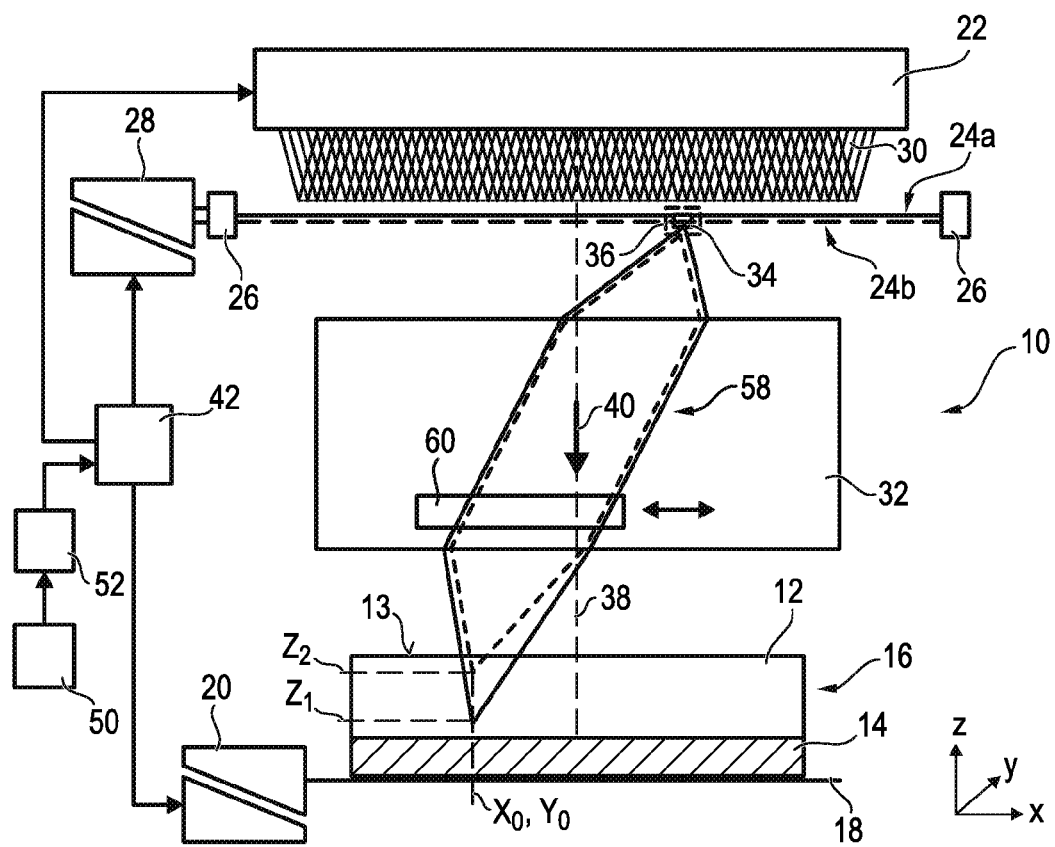
FIG. 11 shows projection exposure system for structuring a photosensitive material.

FIG. 11 depicts a fifth exemplary embodiment of a projection exposure system 10. This exemplary embodiment differs from the exemplary embodiment shown in FIG. 1 in that the focus adjustment between the first focus position $z_1$ and the second focus position $z_2$ in the two consecutive exposure steps is not achieved by moving the wafer 16 in the z-direction, but by inserting a focus adjustment element 60 into an optical path 58 of the optical projection objective 32, which optical path 58 is guiding the light of the projected patterns through the projection objective 32.

The focus adjustment element 60 is moveably mounted within the optical projection objective 32 such that it can be moved in and out of the optical path 58. During the first exposure step, in which a first mask 24a is exposed, the focus adjustment element 60 is removed from the optical path 58 such that the first object structure 34 is focussed onto the first focus position $z_1$. Subsequently, the focus adjustment element 60 is moved into the optical path 58 which causes the focus of the optical projection objective 32 to move to the second focus position $z_2$. Therefore, the second object structure 36 is focussed during the second exposure step at the second focus position $z_2$.

Figure 12:
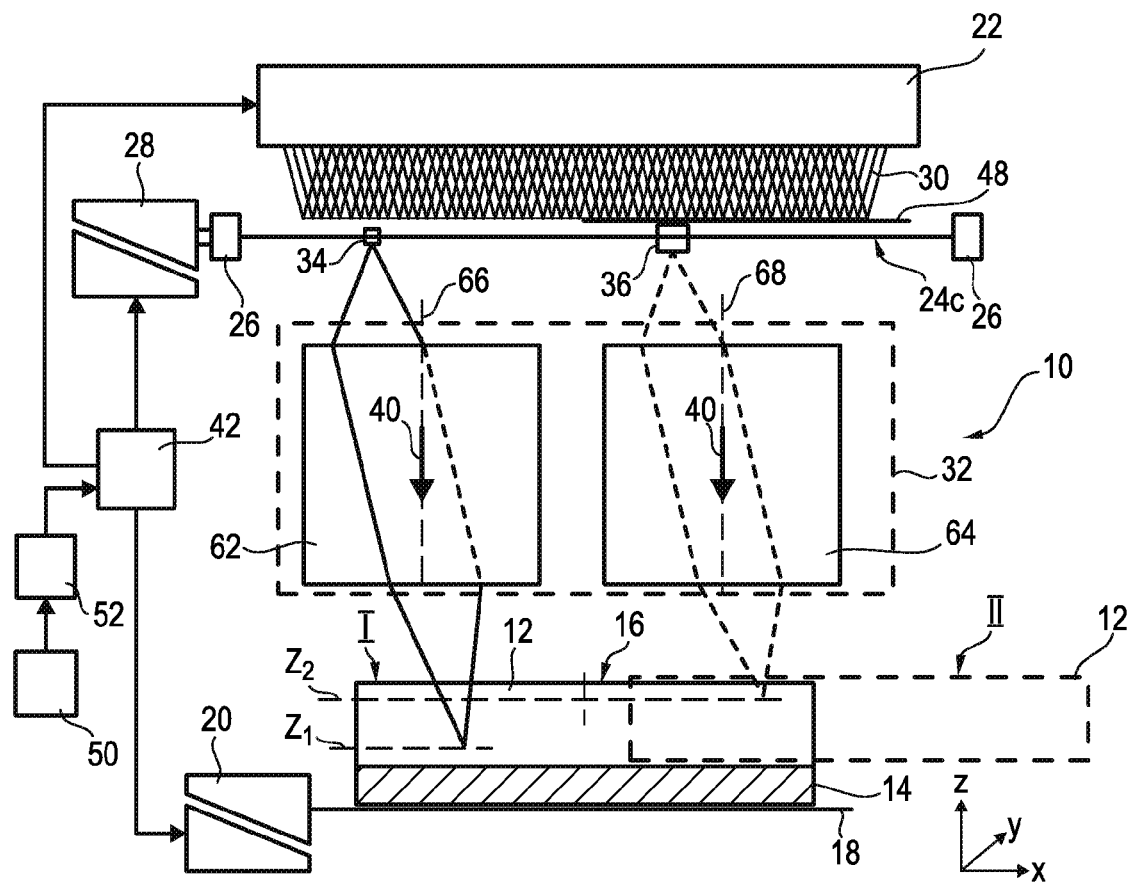
FIG. 12 shows a projection exposure system for structuring a photosensitive material.

FIG. 12 shows a sixth exemplary embodiment of the projection exposure system 10. This exemplary embodiment differs from the exemplary embodiment shown in FIG. 7 in that there are two or more optical projection objectives 62 and 64. The projection objectives 62 and 64 each have an optical axis 66 and 68, respectively, which are arranged parallel to each other at an offset. The projection objectives 62 and 64 are adjusted to different focus positions, namely the first projection objective 62 to a first focus position $z_1$ and the second projection objective 64 to the second focus position $z_2$.

A mask 24c is used having a first object structure 34 and a second object structure 36 arranged on different mask areas as, for example, shown in FIG. 8. The first mask structure 34 is projected by the first projection objectives 62 onto the photosensitive material 12 in a first exposure step during which a mask region containing the second object structure 36 is blocked from the illumination radiation 30 by a mask blade 48. In a subsequent second exposure step the area of the mask 24c containing the first object structure 34 is blocked by the mask blade 48 and the second object structure 36 is projected by the second projection objective 64 onto the photosensitive material 12. Further exemplary embodiments of the projection exposure system 10 according to FIG. 12 can also include three or more separate projection objectives for imaging a larger number of object structures at different focus positions onto the photosensitive material 12.

Figure 13:
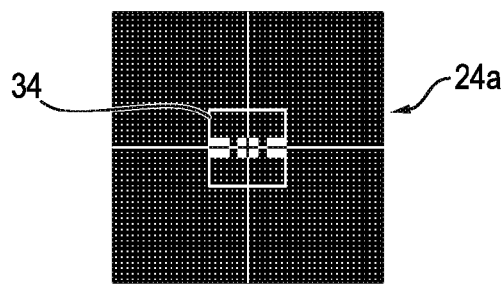
FIG. 13 shows a first mask for use in the projection exposure system according to FIG. 1.
Figure 14:
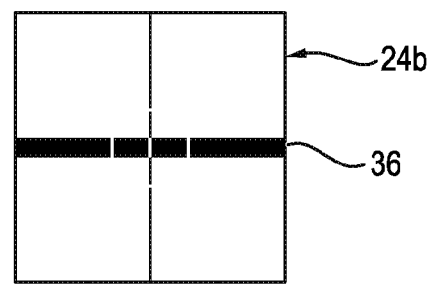
FIG. 14 shows a second mask for use in the projection exposure system according to FIG. 1.
Figure 15:
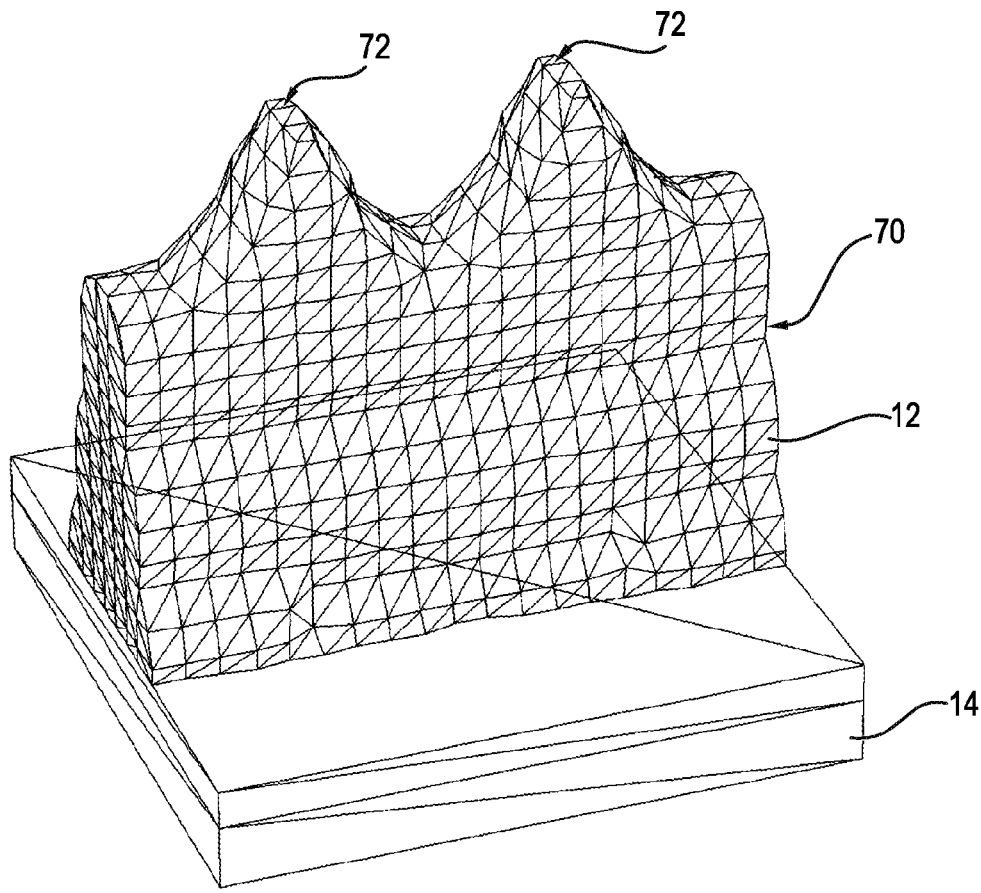
FIG. 15 is a three-dimensional view of a photosensitive material structured three-dimensionally using the masks shown in FIGS. 13 and 14.

FIGS. 13 and 14 show two object structures 34 and 36, respectively, to be imaged onto the photosensitive material 12 using one of the projection exposure systems 10 described above. FIG. 13 shows a first mask 24a having a first object structure 34 including three transmissive contact holes in a dark field surrounding. The contact holes each have a size of 0.2 μm and are arranged at a distance of 0.2 microns. The first object structure 34 is exposed at a defocus setting of 0.8 microns with respect to the upper surface 13 of the photosensitive material 12 and a standard illumination having a partial coherence of $\sigma_{outer}$=0.5 ($\sigma_{inner}$=0). FIG. 14 shows a second mask 34b having an opaque line of a line width of 0.2 microns in a bright surrounding. The second object structure 36 is exposed at a defocus setting of 0.5 microns with respect to the upper surface 13 of the photosensitive material 12 and a standard illumination having a partial coherence of the illumination of $\sigma_{outer}$=0.5 ($\sigma_{inner}$=0). FIG. 15 shows a three-dimensional view of the photosensitive material 12 having a layer thickness of 1 micron structured by exposure of the object structures 34 or 36 shown in FIGS. 13 and 14 at the above mentioned conditions. The structure shown in FIG. 15 has a saddle-shaped base 70 and two bumps 72 on top thereof.

FIGS. 16, 17 and 18 show three different object structures 34, 36 and 74 exposed at different focus settings using any one of the projection exposure systems 12 described above. FIG. 16 depicts a first mask 24a having a first object structure 34 in the form of a vertical transmissive line of a line width of 0.2 microns in a dark field surrounding. The first object structure 34 is exposed with annular illumination defined by $\sigma_{inner}$=0.8 and $\sigma_{outer}$=0.99. The focus setting during the exposure of the first object structure 34 is 1 micron.

FIG. 17 shows a second object structure 36 in the form of a horizontal transmissive line having a line width of 0.2 microns which is exposed at a defocus setting with respect to the upper surface 13 of the photosensitive material 12 of 0 microns with annular illumination defined by $\sigma_{inner}$=0.8 and $\sigma_{outer}$=0.99. FIG. 18 shows a third object structure 74 in the form of an opaque square pad having a side length of 0.6 microns. The third object structure 74d is exposed at a defocus setting of 0.5 microns with respect to the upper surface 13 of the photosensitive material 12. The photosensitive material has a layer thickness of 1 micron.

Figure 20:
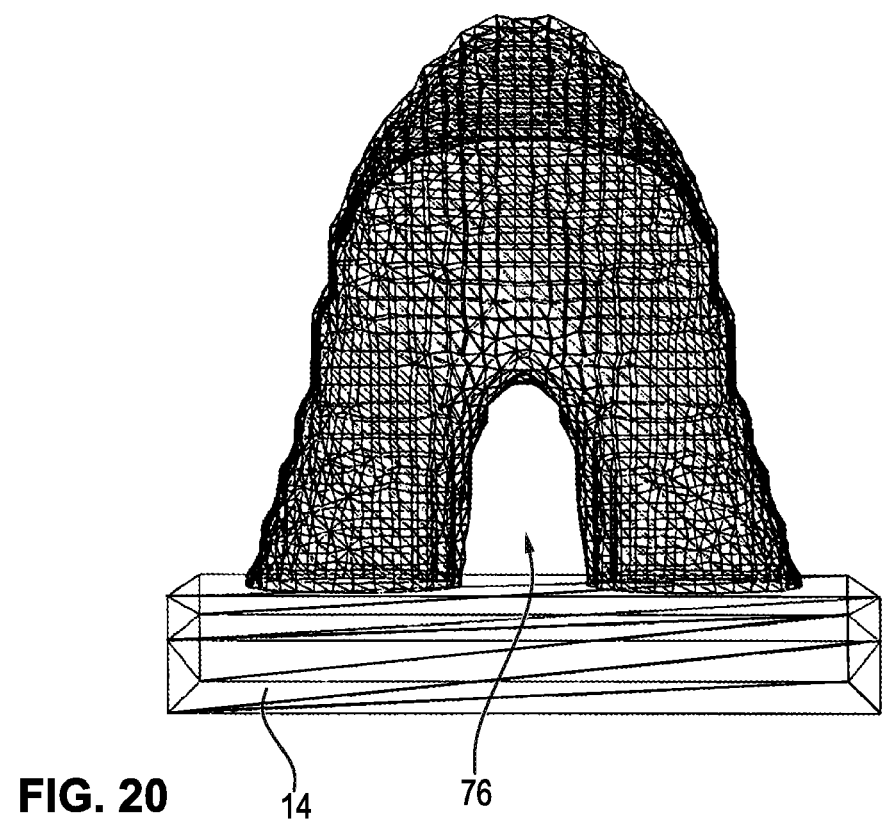
FIG. 20 is a front view of the structured photosensitive material shown in FIG. 19.
Figure 21:
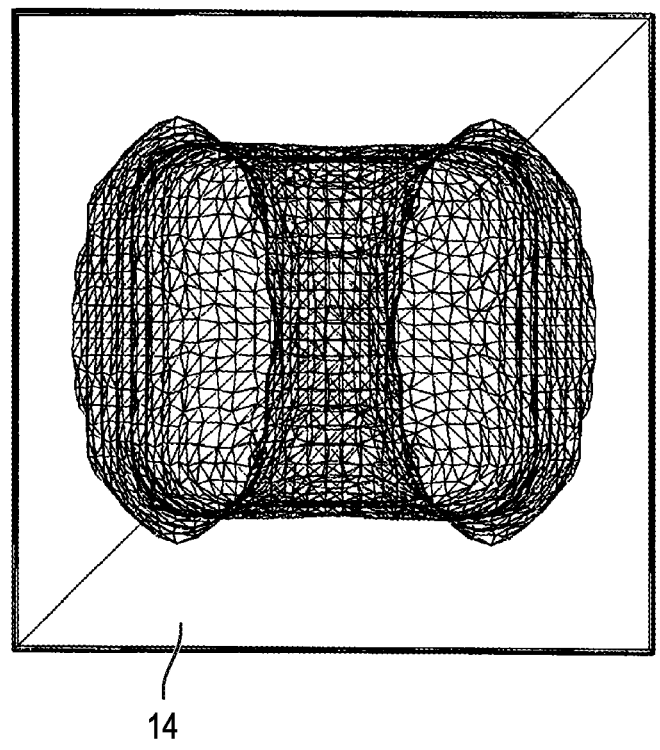
FIG. 21 is a plan view of the structured photosensitive material shown in FIG. 19.

FIGS. 19, 20 and 21 show the resulting three-dimensionally shaped structure of the photosensitive material 12 obtained by exposing the object structures 34, 36 and 74 shown in FIGS. 16 to 18 at the conditions described above. The three-dimensionally shaped structure is characterised by a tunnel 76 and two bumps 72 on top of the structure.

Figure 22:
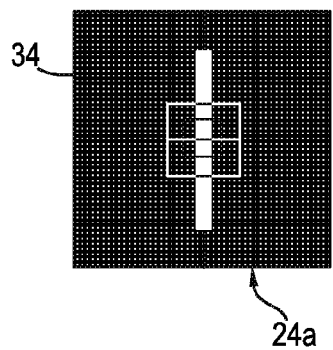
FIG. 22 is a first mask for use in the projection exposure system according to FIG. 1.
Figure 23:
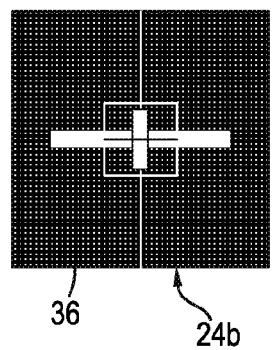
FIG. 23 is a second mask for use in the projection exposure system shown in FIG. 1.
Figure 24:
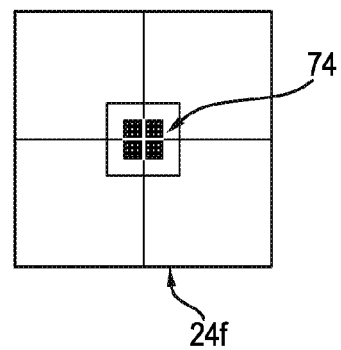
FIG. 24 is a third mask for use in the projection exposure system shown in FIG. 1.

FIGS. 22 to 24 show a further example of object structures 34, 36 and 74 exposed by any one of the projection exposure systems 10 described above. FIG. 22 a first mask 24a containing a first object structure 34 in the form of a vertical line of a line width of 0.2 microns in a dark field surrounding. The first object structure 34 is exposed at a defocus setting of 1 micron with respect to the upper surface 13 of the photosensitive material 12. The illumination setting used thereby is an annular illumination setting defined by $\sigma_{inner}$0.8 and $\sigma_{outer}$=0.99.

FIG. 23 shows a second object structure 36 in the form of crossed transmissive lines of different length, each having a line width of 0.2 microns. The defocus setting for exposing the second object structure 36 of this example is 0 microns with respect to the upper surface 13 of the photosensitive material 12. The illumination used for this exposure is also an annular illumination characterised by $\sigma_{inner}$=0.8 and $\sigma_{outer}$=0.99. FIG. 24 shows a third object structure 74 in the form of an opaque square pad having a side length of 0.6 microns. The third object structure 74 according to FIG. 24 is exposed at standard illumination defined by $\sigma_{inner}$=0 and $\sigma_{outer}$=0.05.

Figure 25:
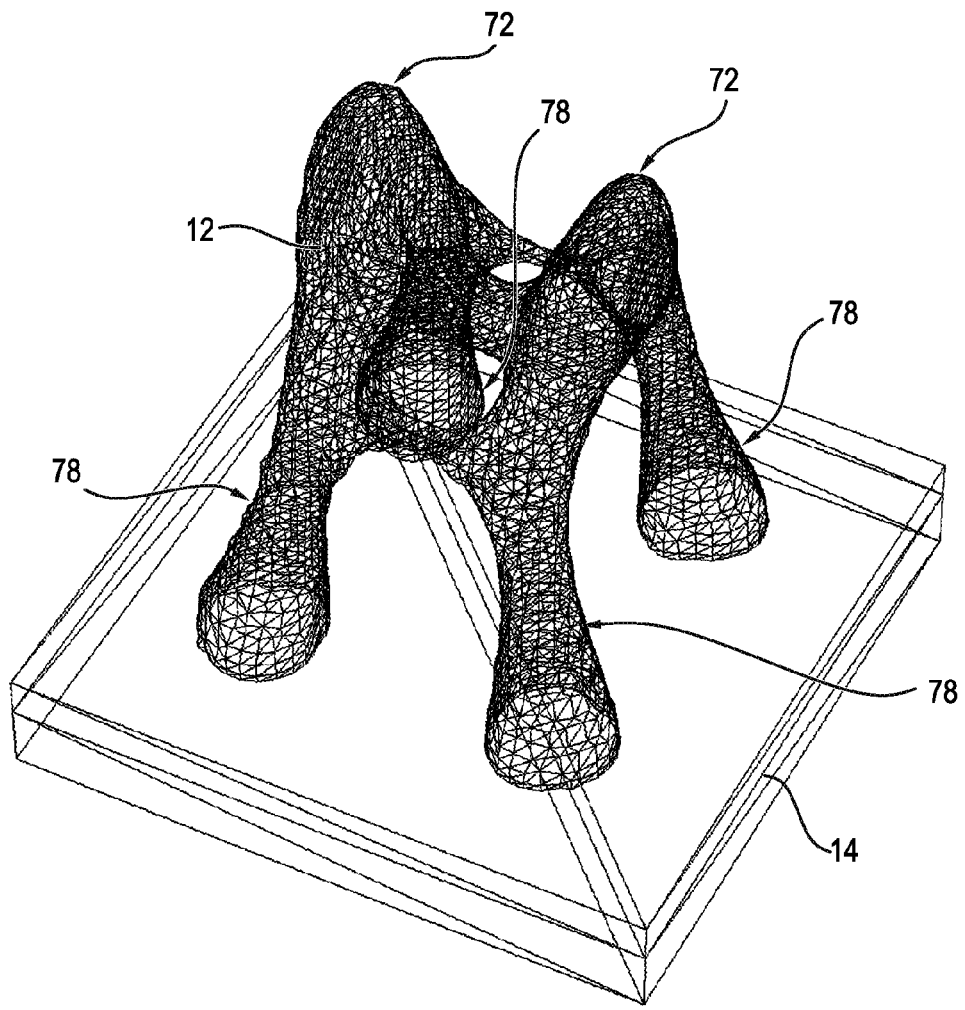
FIG. 25 is a three-dimensional view of a photosensitive material structured three-dimensionally using the masks of FIGS. 22 to 24.
Figure 26:
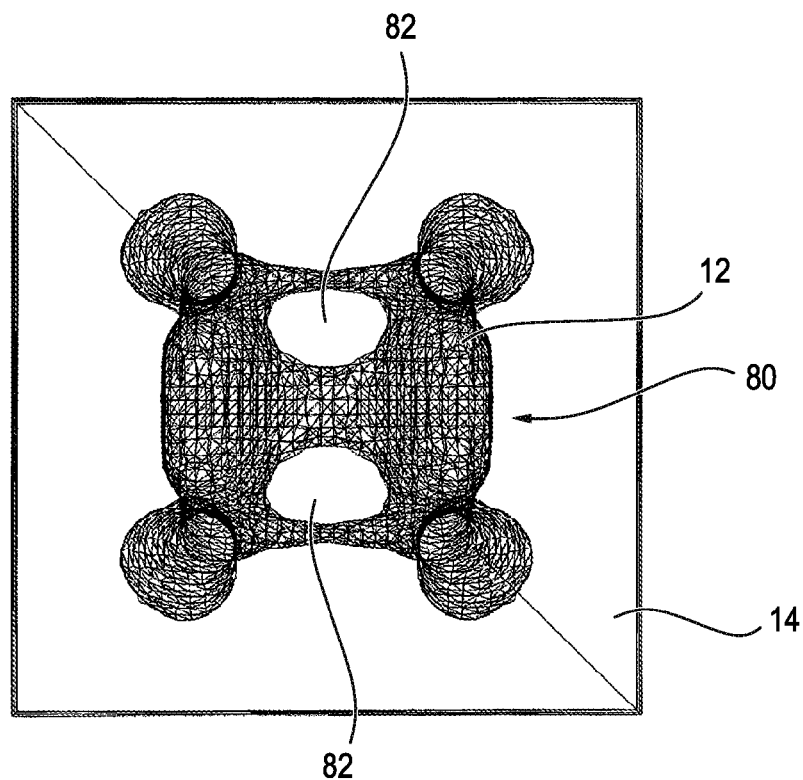
FIG. 26 is a plan view of the photosensitive material shown in FIG. 25.
Figure 27:
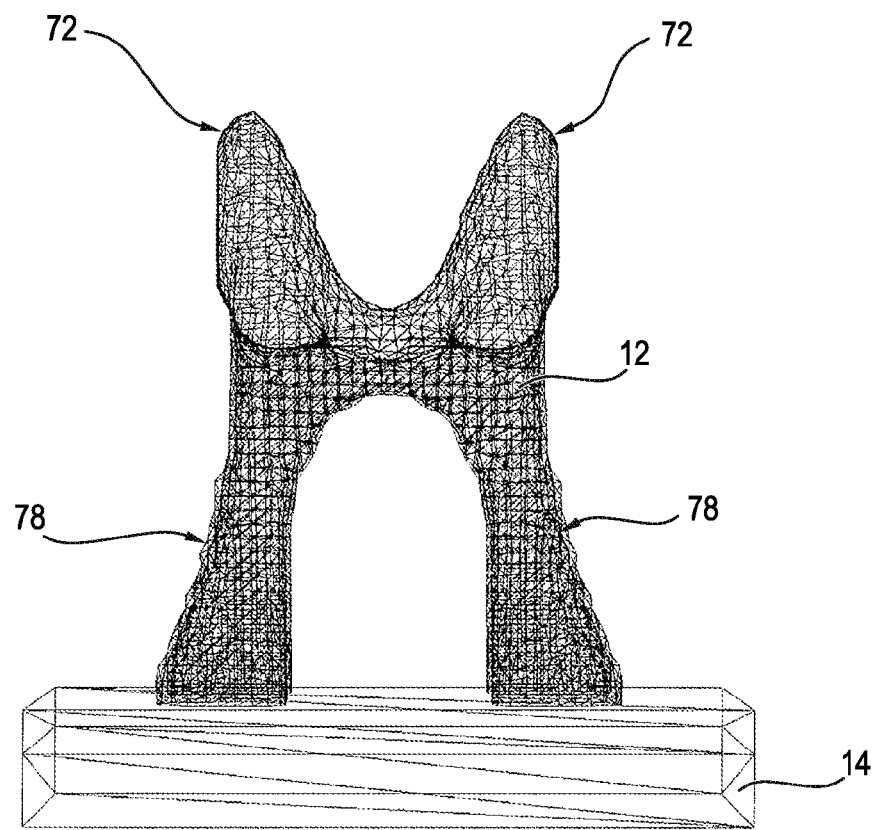
FIG. 27 is a front view of the photosensitive material shown in FIG. 25.

FIGS. 25 to 27 show a three-dimensionally shaped structure in the photosensitive material 12 obtained by exposing the object structures 34, 36 and 74 shown in FIGS. 22 to 24 using the exposure conditions described above. The structure shown in FIGS. 25 to 27 is characterised by four legs 78 and a plateau area 80 containing two holes 82. The structure has two ps 72 on its top.

All exposure conditions used for producing the three-dimensionally shaped structures shown in the figures include a NA of 0.8 and a wavelength of 248 nm. As photosensitive material 12 a resist model of so called UV 210 has been used.

List of Reference Numerals
10 projection exposure system
12 photosensitive material
13 top surface
14 silicon substrate
15 bottom surface
16 wafer
18 material holder
20 wafer stage
22 illumination system
24a first mask
24b second mask
24c single mask
24d single mask
24e single mask
26 mask holder
28 mask stage
30 illumination radiation
32 optical projection objective
34 first object structure
36 second object structure
38 optical axis
40 projection direction
42 control system 44 hole
46 groove
48 mask blade
50 input device
52 calculation device
54 first mask region
56 second mask region
58 optical path
60 focus adjustment element
62 first projection objective
64 second projection objective
66 optical axis
68 optical axis
70 saddle-shaped base
72 bump
74 third object structure
76 tunnel
78 leg
80 plateau
82 hole

What is claimed is:

1. A method, comprising:
    projecting a first pattern of a first object structure onto a photosensitive material such that the projected pattern of the first object structure is focussed at a first focus position with respect to the photosensitive material; and
    projecting a second pattern of a second object structure onto the photosensitive material such that the projected pattern of the second object structure is focussed at a second focus position with respect to the photosensitive material,
    wherein the first and second patterns are projected in the same projection direction, the first and second focus positions are located within the photosensitive material, and the first and second patterns are projected onto the same location of the photosensitive material in a plane perpendicular to the projection direction.

2. The method according to claim 1, wherein the photosensitive material has a thickness in the projection direction, and a distance between the first and second focus positions is at least 10% of the thickness.

3. The method according to claim 1, further comprising:
    illuminating the first object structure with light rays having a first angular distribution; and
    illuminating the second object structure with light rays having a second angular distribution which is different from the first angular distribution.

4. The method according to claim 1, wherein at least one of the first and second object structures is projected onto the photosensitive material as a dark field image.

5. The method according to claim 1, wherein:
    at least one object structure is selected from the group consisting of the first object structure and the second object structures;
    the at least one object structure is projected onto the photosensitive material as a bright field image; and
    the projected pattern of the at least object structure extends in the direction of the projection direction by more than 80% of the thickness of the photosensitive material.

6. The method according to claim 1, wherein:
    the first and second object structures are located on separate masks; and
    the method further comprises, after projecting the pattern of the first object structure, performing a mask change.

7. The method according to claim 1, wherein:
    the first and second patterns are projected onto the photosensitive material using optical projection objective having a numerical aperture of NA;
    the patterns generate material structures in the photosensitive material;
    generating the material structures from the object structures is determined by the lithographic process constant k1; and
    NA/k1 >0.5.

8. The method according to claim 1, wherein the first object structure differs from the second object structure in its orientation, shape and/or size.

9. The method according to claim 1, further comprising simultaneously illuminating the first and second object structures with light having first and second different optical properties, wherein the pattern of the first object structure is generated predominantly or completely from light having the first optical property, and the pattern of the second object structure is generated predominantly or completely from light having the second optical property.

10. The method according to claim 9, wherein the first and second different optical properties are different optical wavelengths of the light.

11. The method according to claim 9, wherein the first and second different optical properties are different orthogonal polarisation states of the light.

12. The method according to claim 1, wherein the method comprises using a projection exposure system, comprising:
    an illumination system configured to illuminate the first and second object structures;
    at least one optical projection objective configured to project the first pattern of the first object structure onto the photosensitive material and configured to project the second pattern of the second object structure onto the photosensitive material; and
    a control device configured to control the operation of the projection exposure system so that the first projected pattern is focussed at the first focus position with respect to the photosensitive material, and so that the second projected pattern is focussed at the second focus position with respect to the photosensitive material.

13. The method according to claim 12, wherein the at least one optical projection objective comprises two projection objectives, each projection objective has an optical axis, the optical axes are parallel and offset relative to each other, and the projection objectives are adjusted to different focus positions.

14. The method according to claim 12, wherein the at least one optical projection objective is configured so that the first and second focus positions can be altered by adjusting a focus adjustment parameter, and the projection exposure system further comprises:
    an input device configured to enter at least one characteristic parameter of the photosensitive material and to enter a desired distance between the first and second focus positions;
    a device configured to calculate an offset value of a focus adjustment parameter from the characteristic parameter and the desired distance, which offset value defines an offset in the focus adjustment parameter involved to adjust the focus position within the photosensitive material from the first focus position to the second focus position; and
    a device configured to automatically adjust the focus adjustment parameter by the calculated offset value.

15. The method according to claim 12, wherein
the at least one optical projection objective has an optical path to guide light during use;
the optical projection objective comprises a focus adjustment element that is moveably mounted within the optical projection objective so that it can moved in and out of the optical path; and
the focus adjustment element is configured to cause a shift in a focus setting of the optical projection objective if the focus adjustment element is moved into the optical path.

16. The method according to claim 12, further comprising a mask that extends along a plane, wherein the mask comprises first and second regions that are offset from each other in a direction perpendicular to the plane.

17. The method according to claim 1, wherein the method comprises using a projection exposure system, comprising:
a mask holder configured to hold a mask having the first and second object structures at different locations of the mask;
a material holder configured to hold the photosensitive material;
an optical projection objective configured to image the mask onto the photosensitive material; and
a control device configured to control the projection exposure system to structure the photosensitive material using the single mask,
wherein the photosensitive material remains on the material holder during while projecting the first and second patterns.

18. The method according to claim 17, wherein the control device is adapted to control the projection exposure system so that the first object structure is imaged onto the photosensitive material at the first focus setting of the optical projection objective and so that the second object structure is imaged onto the photosensitive material at the second focus setting of the optical projection objective.

19. The method according to claim 17, wherein the mask comprises a first exposure region having the first object structure and a second exposure region having the second object structure, and the control device is configured to cause the projection exposure system to image the first and second regions onto the photosensitive material.

20. A method, comprising:
projecting a first pattern of a first object structure onto a photosensitive material such that the projected pattern of the first object structure is focussed at a first focus position with respect to the photosensitive material; and
projecting a second pattern of a second object structure onto the photosensitive material such that the projected pattern of the second object structure is focussed at a second focus position with respect to the photosensitive material,
wherein the first and second patterns are projected in the same projection direction, the first and second focus positions are located within the photosensitive material, the photosensitive material has a thickness in the projection direction, and a distance between the first and second focus positions is at least 10% of the thickness.

21. A method, comprising:
projecting a first pattern of a first object structure onto a photosensitive material such that the projected pattern of the first object structure is focussed at a first focus position with respect to the photosensitive material; and
projecting a second pattern of a second object structure onto the photosensitive material such that the projected pattern of the second object structure is focussed at a second focus position with respect to the photosensitive material,
wherein the first and second patterns are projected in the same projection direction, the first and second focus positions are located within the photosensitive material, and at least one of the first and second object structures is projected onto the photosensitive material as a dark field image.

22. A method, comprising:
projecting a first pattern of a first object structure onto a photosensitive material such that the projected pattern of the first object structure is focussed at a first focus position with respect to the photosensitive material; and
projecting a second pattern of a second object structure onto the photosensitive material such that the projected pattern of the second object structure is focussed at a second focus position with respect to the photosensitive material,
wherein the first and second patterns are projected in the same projection direction, and the first and second focus positions are located within the photosensitive material, and
wherein:
the first and second patterns are projected onto the photosensitive material using optical projection objective having a numerical aperture of NA;
the patterns generate material structures in the photosensitive material;
generating the material structures from the object structures is determined by the lithographic process constant $k1$; and
$NA/k1 > 0.5$.

* * * * *

UNITED STATES PATENT AND TRADEMARK OFFICE
CERTIFICATE OF CORRECTION

PATENT NO.         : 8,358,402 B2
APPLICATION NO.    : 12/698780
DATED              : January 22, 2013
INVENTOR(S)        : Aksel Goehnermeier It is certified that error appears in the above-identified patent and that said Letters Patent is hereby corrected as shown below:

Column 11,
Line 6, delete "a" and insert --σ--

Column 14,
Line 32, delete "0.05." and insert --0.5.--

Column 14,
Line 39, delete "ps" and insert --bumps--

Column 15,
Line 60, delete "at least object" and insert --at least one object--

Signed and Sealed this
Second Day of April, 2013

Teresa Stanek Rea
*Acting Director of the United States Patent and Trademark Office*